United States Patent
Chang et al.

(10) Patent No.: US 11,758,677 B2
(45) Date of Patent: Sep. 12, 2023

(54) FACILITATED EXPANSION CARD REMOVAL

(71) Applicant: QUANTA COMPUTER INC., Taoyuan (TW)

(72) Inventors: Chun Chang, Taoyuan (TW); Hsin-Chieh Lin, Taoyuan (TW); Chih-Hao Chang, Taoyuan (TW); Yi-Fu Liu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 427 days.

(21) Appl. No.: 16/984,326

(22) Filed: Aug. 4, 2020

(65) Prior Publication Data
US 2021/0352818 A1 Nov. 11, 2021

Related U.S. Application Data

(60) Provisional application No. 63/020,714, filed on May 6, 2020.

(51) Int. Cl.
*H05K 7/14* (2006.01)

(52) U.S. Cl.
CPC ......... *H05K 7/1404* (2013.01); *H05K 7/1405* (2013.01)

(58) Field of Classification Search
CPC .. H05K 7/1404; H05K 7/1405; H05K 7/1402; G06F 1/185

USPC .......................................................... 361/801
See application file for complete search history.

(56) References Cited

U.S. PATENT DOCUMENTS

| | | | | |
|---|---|---|---|---|
| 5,815,377 A * | 9/1998 | Lund | ..................... | H01R 12/722 361/756 |
| 5,967,824 A * | 10/1999 | Neal | ....................... | G06F 1/186 439/157 |
| 7,364,447 B1 * | 4/2008 | Desrosiers | .............. | G06F 1/186 439/372 |
| 2002/0131243 A1 * | 9/2002 | Harrison | ................. | H05K 1/117 361/728 |
| 2021/0392770 A1 * | 12/2021 | Wu | ....................... | H05K 7/1409 |

FOREIGN PATENT DOCUMENTS

CN        2435775 Y  *  6/2001   ............... G06F 1/16

* cited by examiner

*Primary Examiner* — Anatoly Vortman
*Assistant Examiner* — Zhengfu J Feng
(74) *Attorney, Agent, or Firm* — NIXON PEABODY LLP

(57) ABSTRACT

A release mechanism is disclosed that can facilitate safely and efficiently removing an expansion card from a computing device. The release mechanism can be installed on a motherboard around an expansion slot, and can include an opening that permits access to the expansion slot to allow an expansion card to be installed therein. When removal of the expansion card is desired, a handled of the release mechanism can be pulled, causing contact surfaces of the release mechanism to push the expansion card away from the expansion slot with even force, removing the need to tilt the expansion card.

20 Claims, 9 Drawing Sheets

FACILITATED EXPANSION CARD REMOVAL

CROSS REFERENCE TO RELATED APPLICATIONS

The present application claims the benefit of U.S. Provisional Application No. 63/020,714 filed May 6, 2020 and entitled "TOOL-LESS MECHANISM FOR PCIe CARD," which is hereby incorporated by reference in its entirety.

TECHNICAL FIELD

The present disclosure relates to computing systems generally and more specifically to removal of expansion cards from computing systems.

BACKGROUND

Many computing systems make use of expansion cards for various purposes, such as supplemental processing (e.g., graphics processing), network interfacing, peripheral interfacing, storage, and other uses. A multipurpose motherboard or base board can be easily and quickly configured for a specific purpose or use case through the addition of certain combinations of expansion cards. Additionally, the system can be quickly repurposed by simply removing and replacing existing expansion cards with new cards. Furthermore, failure of an expansion card can be quickly remedied through removal and replacement of the failed expansion card.

Numerous expansion card interfaces exist, such as the commonly used interface standard Peripheral Component Interconnect Express (PCIe) interface. While expansion card interfaces can take various form factors, an important form factor is the perpendicular expansion slot. The perpendicular expansion slot allows an expansion card with an edge connector to be inserted into and captured by the expansion slot so that the expansion card is held perpendicular to the motherboard. Perpendicular expansion slots allow many expansion cards to be placed in close proximity across a width of a motherboard. Additionally, the use of perpendicular expansion slots allows each expansion card to occupy a certain height near an edge of the motherboard, permitting external ports or other interfacing elements to be visible and/or accessed through the chassis in which the motherboard is located. For example, a network interface expansion card may include several stacked networking ports.

Insertion and removal of expansion cards is a common, manual practice, with engineers and users manually inserting the expansion card into the expansion slot and manually removing the expansion card from the expansion slot. Users often tilt an expansion card with respect to the expansion slot to remove the expansion card. This practice can damage the circuit board of the expansion card, damage the electrical connections of the expansion card or expansion slot, and damage the mechanical structure of the expansion slot.

While expansion cards and expansion slots are designed to be somewhat mechanically robust, there is still a significant risk of damage to either the expansion card or expansion card slot, especially during removal of the expansion card. Further, with increasing demands for high-density servers, the need for close-packed expansion slots exists. When expansion cards are installed in such close-packed expansion slots, the risk for damage to one or more cards during removal of an expansion card is even higher. If an expansion card is damaged, it may have to be repaired or replaced. If the expansion slot is damaged, repairs or replacement can be extremely costly in terms of actual costs and lost server time.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a system comprising a motherboard having a surface and an expansion slot coupled to the surface of the motherboard for receiving an expansion board in a first direction perpendicular to the surface of the motherboard. The expansion slot has a plurality of contacts for electrically coupling the received expansion board to the motherboard. The system also comprises an expansion card release mechanism coupled to the motherboard. The expansion card release mechanism comprises a set of contact surfaces, including a first contact surface located opposite the expansion slot from a second contact surface. The expansion card release mechanism also comprises a slider movable in a second direction perpendicular to the first direction, wherein movement of the slider in the second direction induces movement of the set of contact surfaces in a third direction opposite to the first direction. Each contact surface of the set of contact surfaces is sized such that movement of the set of contact surfaces in the third direction provides force to urge the received expansion board in the third direction.

In some cases, the expansion card release mechanism is positioned around the expansion slot. In some cases, the expansion card release mechanism comprises one or more biasing devices to bias the set of contact surfaces in the first direction. In some cases, the motherboard comprises a set of apertures adjacent the expansion slot. In some cases, the expansion card release mechanism comprises a housing for coupling the expansion card release mechanism to the motherboard. In some cases, the housing comprises a set of hooks for engaging each of the set of apertures adjacent the expansion slot. In some cases, the slider comprises a handle to facilitate moving the slider in the second direction. In some cases, the handle extends in the second direction past an edge of the received expansion card such that the handle is accessible when the received expansion card is installed in the expansion slot. In some cases, movement of the set of contact surfaces in the third direction to provide force to urge the received expansion board in the third direction comprises providing equal force at each of the contact surfaces of the set of contact surfaces. In some cases, the expansion card release mechanism comprises a housing that is separate from a housing of the expansion slot.

Embodiments of the present disclosure include an expansion card release apparatus comprising a housing positionable on a motherboard having an expansion slot for receiving an expansion card in a first direction perpendicular to a surface of the motherboard. The housing can comprise a first end and a second end separate by an opening that is shaped to provide access to the expansion slot. The expansion card release apparatus can also comprise a set of contact surfaces that include a first contact surface located at the first end of the housing and a second contact surface located at the second end of the housing. The expansion card release apparatus can also comprise an actuator coupled to the set of contact surfaces to induce movement of the set of contact surfaces in a second direction opposite to the first direction. Each contact surface of the set of contact surfaces is sized such that movement of the set of contact surfaces in the second direction provides force to urge the received expansion board in the second direction.

In some cases, the actuator comprises a slider, and wherein movement of the slider in a third direction perpendicular to the first direction induces movement of the set of contact surfaces in the second direction. In some cases, the apparatus further comprises one or more biasing devices to bias the set of contact surfaces in the first direction. In some cases, the housing comprises a set of hooks for engaging apertures of the motherboard to secure the housing to the motherboard. In some cases, the actuator comprises a handle to facilitate actuating the actuator, wherein the handle is sized to extend past an edge of the expansion card such that the handle is accessible when the expansion card is installed in the expansion slot. In some cases, movement of the set of contact surfaces in the second direction to provide force to urge the expansion board in the second direction comprises providing equal force at each of the contact surfaces of the set of contact surfaces. In some cases, the housing is separate from a housing of the expansion slot.

Embodiments of the present disclosure include a method comprising providing a motherboard having an expansion slot coupled to a surface of the motherboard. The method also comprises installing an expansion card in the expansion slot, wherein installing the expansion card includes inserting the expansion card into the expansion slot in a first direction perpendicular to the surface of the motherboard. The method also comprises removing the expansion card from the expansion slot using an expansion card release mechanism. Removing the expansion card using the expansion card release mechanism comprises providing force to move a slider of the expansion card release mechanism in a second direction perpendicular to the first direction. Removing the expansion card using the expansion card release mechanism also comprises moving a set of contact surfaces of the expansion card release mechanism in a third direction opposite the first direction in response to movement of the slider in the second direction. Each contact surface of the set of contact surfaces is sized such that movement of the set of contact surfaces in the third direction provides force to urge the expansion board in the third direction.

In some cases, providing the motherboard comprises coupling the expansion card release mechanism to the motherboard around the expansion slot. In some cases, moving the set of contact surfaces of the expansion card release mechanism in the third direction, in response to movement of the slider in the second direction, comprises applying sufficient force to overcome one or more biasing devices configured to bias the set of contact surfaces in the first direction. In some cases, providing the motherboard comprises coupling the expansion card release mechanism to the motherboard by inserting a set of hooks of the expansion card release mechanism into a set of apertures of the motherboard. In some cases, the slider comprises a handle to facilitate moving the slider in the second direction, wherein the handle extends in the second direction past an edge of the expansion card such that the handle is accessible when the expansion card is installed in the expansion slot. In some cases, movement of the set of contact surfaces in the third direction to provide force to urge the received expansion board in the third direction comprises providing equal force at each of the contact surfaces of the set of contact surfaces.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
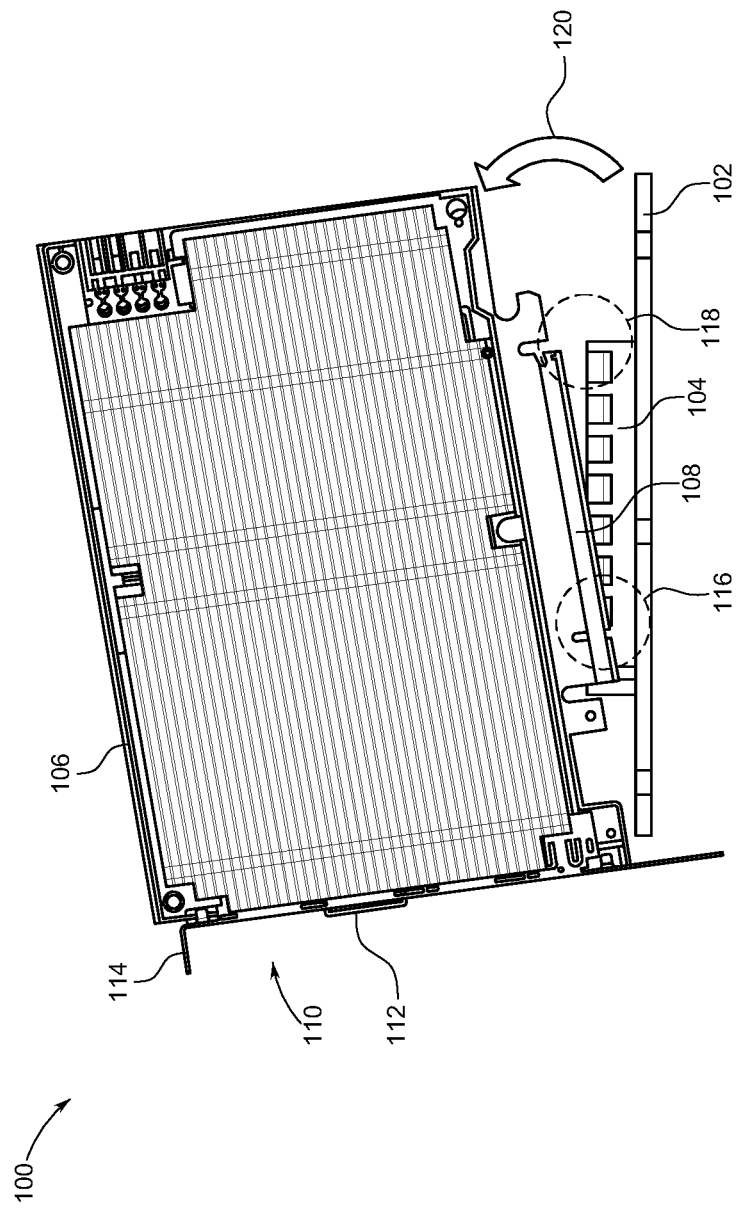
FIG. 1 is a side view of a conventional expansion card during removal from an expansion slot of a motherboard.

Certain aspects and features of the present disclosure relate to a release mechanism that facilitates safely and efficiently removing an expansion card from a computing device. The release mechanism can be installed on a motherboard around an expansion slot, and can include an opening that permits access to the expansion slot to allow an expansion card to be installed therein. When removal of the expansion card is desired, a handled of the release mechanism can be pulled, thereby causing contact surfaces of the release mechanism to push the expansion card away from the expansion slot with even force and, thus removing the need to tilt the expansion card.

Expansion cards, such as Peripheral Component Interconnect Express (PCIe) cards, are often used to expand the functionality of a computing device, such as a sever or home computer. Expansion cards are installed in expansion slots (e.g., expansion card sockets) by inserting a connector of the expansion card (e.g., a Golden Finger connector or the like) into the expansion slot, whereupon electrical contacts of the expansion card meet with electrical contacts of the expansion slot to provide electrical connectivity between the expansion card and a motherboard (e.g., main board) of the computing device. As used herein, the term motherboard can be a main board of a computing device. As used herein, the term motherboard can refer, as appropriate, to any printed circuit board (PCB) that includes an expansion slot into which an expansion card can be installed.

When installed, some expansion cards provide an externally-facing interface through an opening in the chassis of the computing device. For example, an expansion card used as a graphics card can provide one or more video ports (e.g., a High Definition Multimedia Interface (HDMI) port) in an interface panel that faces out from the rear of the chassis. This interface panel is often located at a first end (e.g., rear end) of the expansion card. The expansion card, comprising a flat or generally flat PCB, will have at least two opposing ends (e.g., a front end and a rear end) and two opposing planar or generally planar sides (e.g., a first side and a second side).

Often, expansion slots are oriented to allow the expansion card to be installed in a direction perpendicular to a plane or surface of the motherboard. Conventionally, expansion cards installed in an expansion slot are removed by tilting the expansion card to remove one end of the connector of the expansion card from the expansion slot before fully removing the connector from the expansion slot. This tilting technique is often used because it only requires a user to manipulate opposite ends of the expansion card, which are often much more readily accessible than the sides of the expansion card. Unfortunately, this tilting technique can damage the expansion card and/or the expansion slot, which can lead to significant repair or replacement expenses, as well as undesirable downtime.

With the advent of new computing requirements, especially those related to 5G wireless, there is a need for high-density computing devices. Often, such devices leave little or minimal room between an expansion card and adjacent elements (e.g., additional expansion cards, power supplies, chassis walls, fan modules, ducting, or any other elements of the computing device). Thus, the ability to access and grasp expansion cards is limited when the empty space adjacent the expansion cards is reduced. As a result, such expansion cards may be removed using the tiling technique, which can result in undesired damage, expense, and downtime.

Certain aspects and features of the present disclosure relate to a release mechanism that can be installed on a motherboard, such as at, adjacent, or around an expansion slot, to facilitate safe and efficient release of the expansion card. The release mechanism can include an actuator, such as a handle, that can be actuated (e.g., pulled, pushed, pressed, or turned) to cause contact surfaces (e.g., mechanically contacting surfaces) of the release mechanism to push the expansion card away from the expansion slot. As used herein, the term "contact surface" can refer to a surface or portion of a surface that engages the expansion card to apply force to the expansion card. In some cases, the contact surfaces can contact the expansion card at locations on opposite sides of the expansion slot. In some cases, each of the contact surfaces can be configured to apply equal force to the expansion card, thus pushing the expansion card away from the expansion slot in an even fashion, without tilting the expansion card. In some cases, the contact surfaces can be configured to push the expansion card away from the expansion slot with a tilt of at or less than 10°, 9°, 8°, 7°, 6°, 5°, 4°, 3°, 2°, or 1°.

Each contact surface can be positioned to contact a receiving surface of the expansion card. The receiving surface can be any suitable surface of the expansion card, but is often a bottom edge of the PCB of the expansion card. In some cases, the contact surfaces can be shaped to conform to the bottom edge of the expansion card. For example, a contact surface can include a ridge having a width that is slightly greater than a width of the PCB of the expansion card, permitting the expansion card to fit within the ridge when the contact surface is applying force to the expansion card.

In some cases, the contact surfaces can be separate elements that are manipulated simultaneously through actuation of the actuator (e.g., pulling of the handle). In some cases, the contact surfaces can be separate locations of a single, contiguous element.

In some cases, the actuator can be or be coupled to a slider located within a housing of the release mechanism. The slider can be moved linearly between a first position and a second position. In a first position, the slider can permit the contact surfaces to fall, retract, or otherwise increase distance between the contact surfaces and the expansion card. In the second position, the slider can induce the contact surfaces to extend or otherwise move to cause the contact surfaces to apply force to the expansion card to urge the expansion card away from the expansion slot. In an example, the contact surfaces can be exposed surfaces of contact elements, which can include one or more inclined planes that interact with one or more inclined planes of the slider to cause the contact elements to move away from the motherboard (e.g., towards the expansion card).

In some cases, one or more biasing mechanisms can be used to urge the contact surfaces (e.g., contact elements) to retract or otherwise move towards the motherboard. In such cases, force applied to the actuator (e.g., handle or slider) can be sufficient to overcome the biasing force of the biasing mechanism, thus forcing the contact surfaces away from the motherboard.

In some cases, the release mechanism can supply sufficient force to the expansion card to fully remove the expansion card from the expansion slot, although that need not always be the case. In some cases, the release mechanism can supply sufficient force to facilitate removal of the expansion card from the expansion slot.

In some cases, the actuator (e.g., handle) of the release mechanism can be positioned such that it extends beyond an edge (e.g., front edge) of the expansion card when installed. In other words, the handle can be visible and accessible despite the presence of an expansion card in the expansion slot. In some cases, release mechanisms can come in different sizes, permitting one to select the desired size as needed for a particular purpose (e.g., for a particular expansion card) for installation into the motherboard prior to installing the expansion card.

In some cases, the release mechanism is removable couplable to the motherboard, such as through the use of releasable hooks designed to engage apertures (e.g., openings, holes, or cutouts) in the motherboard. Other coupling techniques can be used to secure the release mechanism to the motherboard. Generally, the release mechanism can be designed to fit around an expansion slot. In such cases, the release mechanism can be shaped to include an opening through which the expansion slot remains accessible. In some cases, however, the release mechanism can be installed adjacent to an expansion slot, without necessarily surrounding the slot.

In some cases, certain aspects and features of the disclosed release mechanism can be incorporated into a housing of an expansion slot. In such cases, the expansion slot may be slightly larger than a conventional expansion slot, including contact surfaces to facilitate removal of the expansion card as disclosed herein.

The release mechanisms disclosed herein are disclosed with reference to a single expansion slot for illustrative purposes. In some cases, however, a single housing can include multiple release mechanisms and multiple openings for expansion slots. Thus, installation of a single housing on the motherboard can provide release mechanisms for a number of expansion slots.

The release mechanism disclosed herein can be used with any suitable expansion card and expansion slot. However, certain aspects of the present disclosure are especially well-suited for use with PCIe cards and PCIe slots, due at least to the form factor and conventional uses for PCIe cards.

These illustrative examples are given to introduce the reader to the general subject matter discussed here and are not intended to limit the scope of the disclosed concepts. The following sections describe various additional features and examples with reference to the drawings in which like numerals indicate like elements. Directional descriptions are used to describe the illustrative embodiments but, like the illustrative embodiments, should not be used to limit the present disclosure. The elements included in the illustrations herein may not be drawn to scale.

FIG. 1 is a side view of a computer system 100 with a conventional expansion card 106 during removal from an expansion slot 104 of a motherboard 102. The expansion card 106 can include a rear panel 110 exposing an interface port 112. The panel 110 can include a panel lip 114 to help mechanically secure the expansion card 106 to a chassis. For illustrative purposes, expansion slot 104 is depicted in cutaway view, showing only the portion of the expansion slot 104 behind the expansion card 106.

During conventional removal of the expansion card 106 from the expansion slot 104, the expansion card 106 is tilted in direction 120, often by grabbing the expansion card 106 at one or both of a rear end and front end (e.g., left and right end of the expansion card 106 as depicted in FIG. 1, respectively). During this tilting movement, there is a significant risk of a connector 108 of the expansion card 106 damaging or being damaged by the expansion slot 104. Often, damage occurs at pinch point 116 or pinch point 118.

Figure 2:
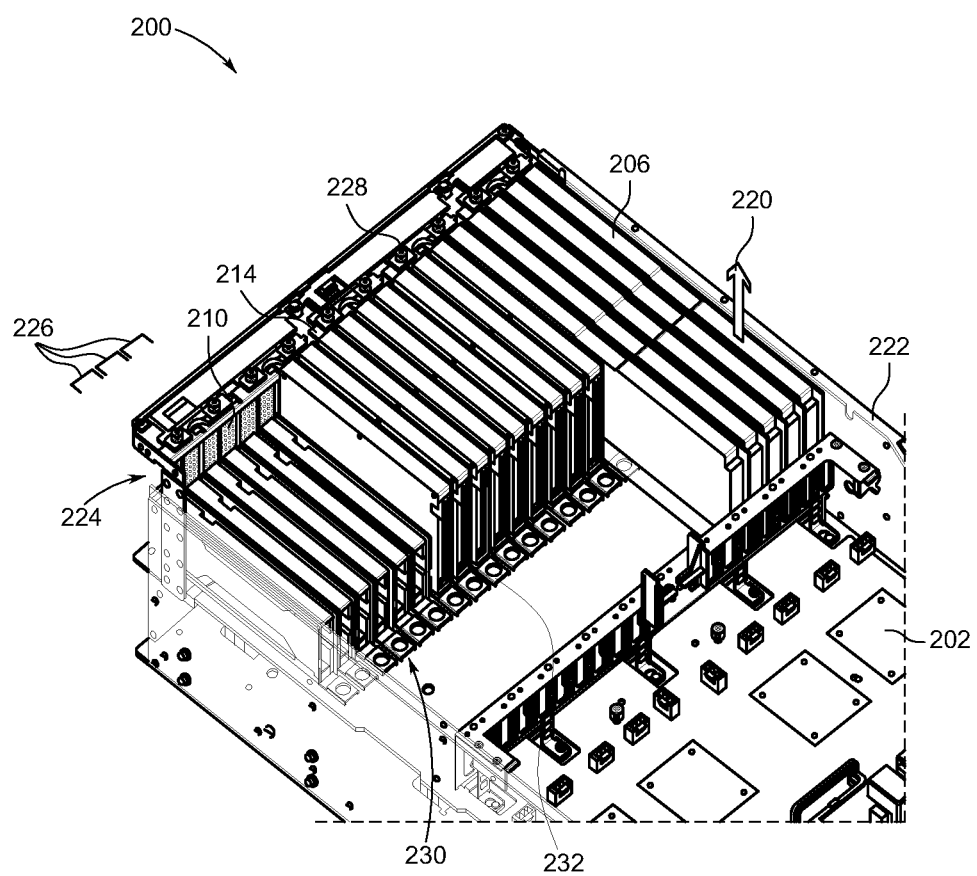
FIG. 2 is an axonometric projection of a computing device with multiple expansion cards, according to certain aspects of the present disclosure.

FIG. 2 is an axonometric projection of a computing device 200 with multiple expansion cards 206, according to certain aspects of the present disclosure. The computing device 200 shows six half-height half-length, nine full-height half-length, and five full-height full-length cards, although any number of expansion cards 206 of any suitable sizes can be used. The expansion cards 206 can be similar to expansion card 106 of FIG. 1. Motherboard 202 can be similar to motherboard 102 of FIG. 1, although with the addition of expansion card release mechanisms 230.

The motherboard 202 can have multiple expansion card positions 226, each including an expansion slot and an expansion card release mechanism 230. As depicted in FIG. 2, each expansion card position 226 is filled with an expansion card 206 installed in the corresponding expansion slot. In some cases, each expansion card can be secured to the chassis 222 at the rear of the chassis 224, although that need not always be the case. As depicted in FIG. 2, each expansion card 206 includes a panel 210 that is secured to the chassis 222 at the panel lip 214 by a panel securement feature 228 (e.g., a screw, bolt, clamp, or other suitable feature).

As disclosed in further detail herein, when removal of an expansion card 206 is desired, a user can manipulate the handle 232 of the release mechanism 230 of the relevant expansion card 206 to cause the expansion card 206 to move in direction 220 (e.g., an upward direction or normal direction away from the motherboard 202).

Figure 3:
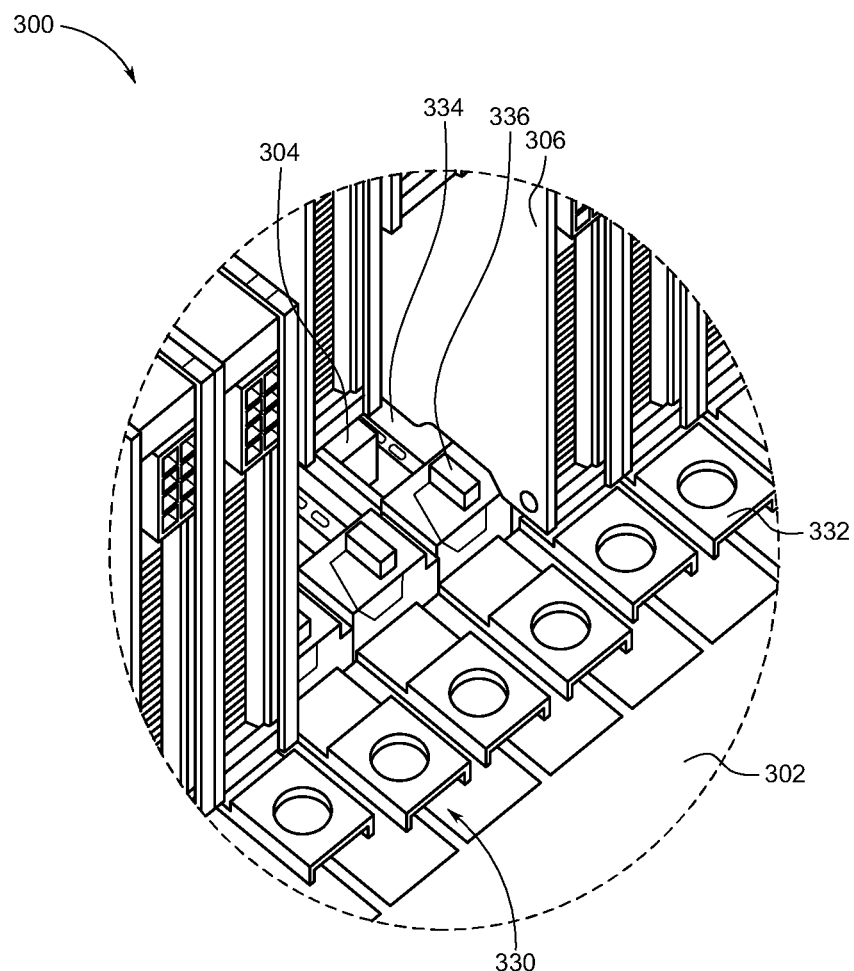
FIG. 3 is a close-up view of a computing device with expansion slots and expansion card release mechanisms, according to certain aspects of the present disclosure.

FIG. 3 is a close-up view of a computing device 300 with expansion slots 304 and expansion card release mechanisms 330, according to certain aspects of the present disclosure. As depicted in FIG. 3, some expansion slots 304 are empty and one of the expansion cards 306 is not installed in the expansion slot 304.

Each release mechanism 330 can include a housing 334 coupling the release mechanism 330 to the motherboard 302. The housing 334 can include an opening sufficient to permit access to the expansion slot 304. The release mechanism 330 can include a handle 332 that is used to actuate contact surfaces 336. When the handle 332 is pulled, the contact surfaces 336 are extended away from the motherboard, thus applying force to urge the expansion card 306 away from the motherboard 302, and thus out of the expansion slot 304. While depicted in FIG. 3 as a handle 332 being pulled, a release mechanism 330 can make use of other manually manipulatable (e.g., hand-actuated) actuators to cause the contacting surfaces 336 to apply force to urge the expansion card 306 away from the motherboard 302.

Figure 4:
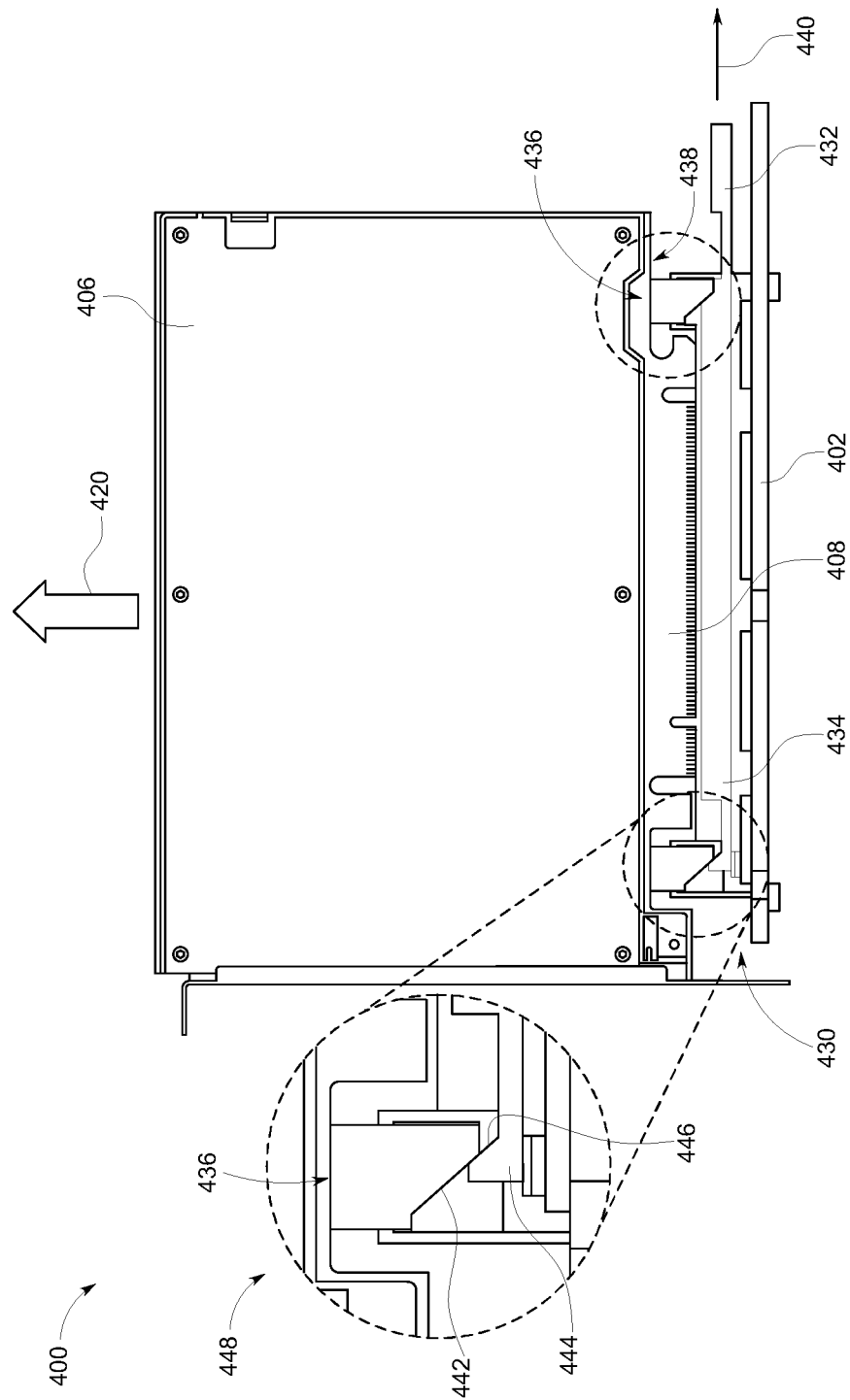
FIG. 4 is a combination side view and expanded side view of an expansion card during removal from a motherboard equipped with an expansion card release mechanism, according to certain aspects of the present disclosure.

FIG. 4 is a combination side view and expanded side view of a computer system 400 with an expansion card 406 during removal from a motherboard 402 equipped with an expansion card release mechanism 430, according to certain aspects of the present disclosure. The expansion card 406 can be similar to expansion card 206 of FIG. 2. The motherboard 402 can be similar to motherboard 202 of FIG. 2. The release mechanism 430 can be similar to release mechanism 230 of FIG. 2. Expansion card 406 is shown in a partially removed state, after contact surfaces 436 have urged the expansion card 406 out of the expansion slot (not depicted for illustrative purposes). Additionally, for illustrative purposes, the housing 434 is depicted in cutaway form to expose the inner workings of the release mechanism 430.

The release mechanism 430 is shown having a housing 434 coupled to the motherboard 402. A handle 432 has been slid in direction 440, causing contact surfaces 436 to move in direction 420 and push up against receiving surfaces 438 of the expansion card 406, thus causing the expansion card 406 to move in direction 420.

As shown in the expanded side view, an output mechanism 448 converts actuation of the handle 432 in direction 440, or other movement of another actuator (e.g., rotation of a knob), to move the contact surfaces 436 in direction 420. As depicted in FIG. 4, movement of handle 432 in direction 440 can cause a slider 444 to push its inclined plane 446 against a contact element 442, thus causing the contact surface 436 of the contact element 442 to move in direction 420. Other output mechanisms 448 can be used to convert actuation of an actuator (e.g., handle 432) into movement of contact surface 436 in direction 420.

As depicted in FIG. 4, two contact surfaces 436 are located on opposite sides of the expansion slot to contact receiving surfaces 438 of the expansion card 406 that are on opposite sides of the connector 408. In some cases, the release mechanism 430 can be configured to apply equal force to the receiving surfaces 438 of the expansion card 406, thus causing the expansion card 406 to be pushed in direction 420 with minimal or no tilt.

Figure 5:
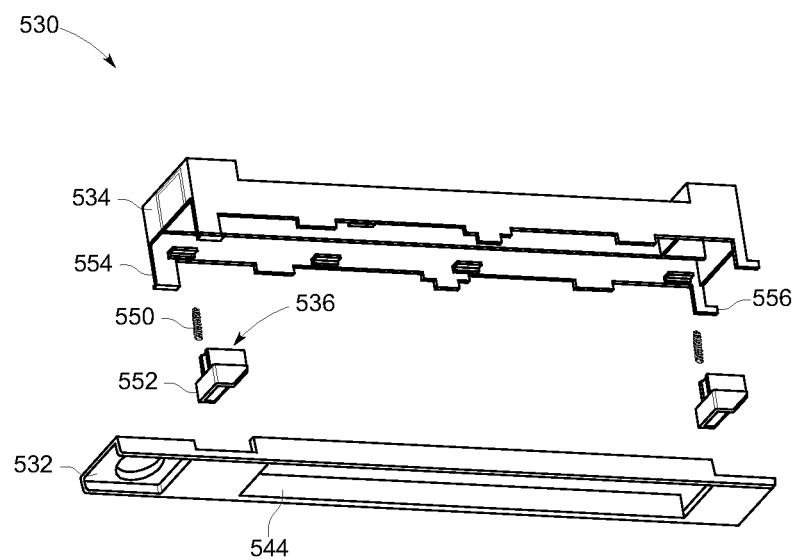
FIG. 5 is an exploded diagram depicting an expansion card release mechanism, according to certain aspects of the present disclosure.

FIG. 5 is an exploded diagram depicting an expansion card release mechanism 530, according to certain aspects of the present disclosure. The release mechanism 530 can be similar to release mechanism 230 of FIG. 2.

The release mechanism 530 can include a housing 534 with hooks 554, 556 designed to couple the housing 534 to a motherboard, although other coupling mechanisms can be used. The housing 534 can include an opening through which an expansion slot can be accessible or through which an expansion card's connector can be inserted to install the expansion card into an expansion slot surrounded by the release mechanism 530.

The release mechanism 530 can include a slider 544 coupled to a handle 532. The slider 544 can move linearly in a forward or backward direction (e.g., left or right as depicted in FIG. 5) in response to force applied to handle 532 in the forward or backward direction.

Movement of the handle 532 in the forward direction (e.g., left as depicted in FIG. 5) can cause an inclined plane of the slider 544 to push against a contact element 552, thus pushing the contact element 552 out of and/or further past the top of the housing 534. A top surface 536 of the contact element 552 can be the contact surface that applies force to the expansion card to urge the expansion card away from the expansion slot.

In some cases, the release mechanism 530 can include a biasing element 550 (e.g., a spring) that urges the contact element 552 into a retraction position (e.g., downwards as depicted in FIG. 5). In some cases, the biasing element 550 can be positioned between the housing 534 and a portion of the contact element 552.

Other designs for a release mechanism 530 can be used.

Figure 6:
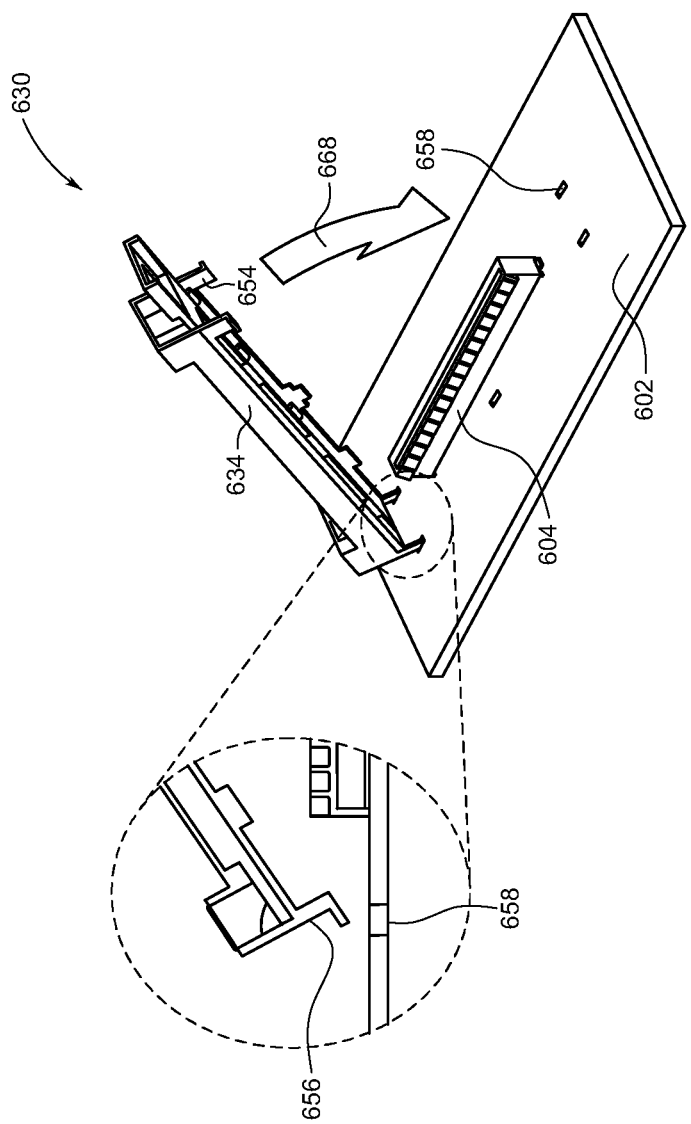
FIG. 6 is a combination isometric view and expanded side view depicting an expansion card release mechanism during installation on a motherboard, according to certain aspects of the present disclosure.

FIG. 6 is a combination isometric view and expanded side view depicting an expansion card release mechanism 630 during installation on a motherboard 602, according to certain aspects of the present disclosure. Motherboard 602 can include a set of apertures 658 adjacent the expansion slot 604. Release mechanism 630 and motherboard 602 can be similar to release mechanism 230 and motherboard 202 of FIG. 2, respectively.

Release mechanism 630 can include a housing 634 having a first set of hooks 656 and a second set of hooks 654. The first set of hooks 656 include a dogleg shape to engage apertures 658 of the motherboard 602. The second set of hooks 654 can include inclined planes and lips that removably engage (e.g., clip to) apertures 658 of the motherboard 602 when placed therethrough. During installation of the release mechanism 630, the first set of hooks 656 can first be placed in corresponding apertures 658 of the motherboard 602, then the housing 634 can be rotated down in direction 668 until the second set of hooks 654 are pushed through corresponding apertures 658, after which the second set of hooks 654 will releasable engage the motherboard 602.

Other techniques can be used to removably or permanently couple a release mechanism 630 to a motherboard 602. In some cases, the release mechanism 630 can be incorporated into other hardware of or coupled to the motherboard, such as incorporated into the expansion slot 604 itself.

Figure 7:
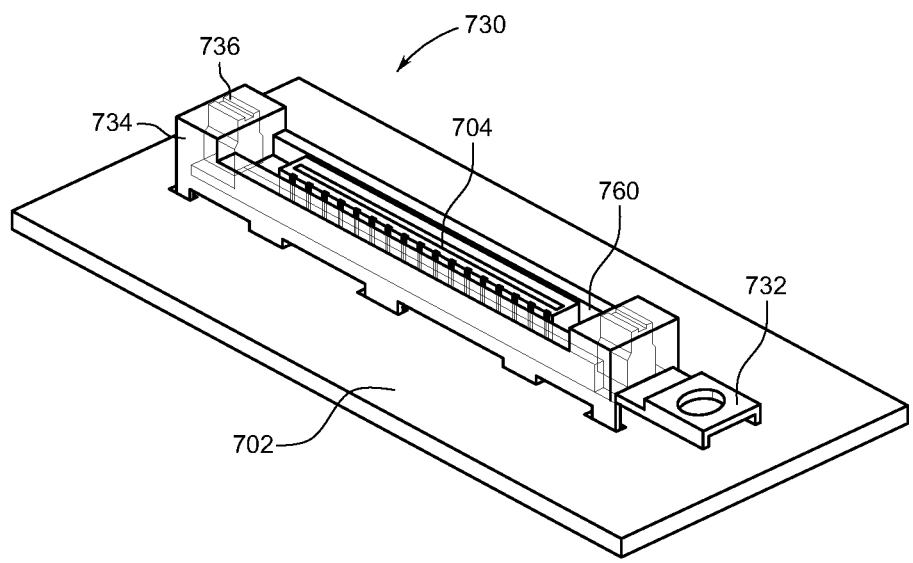
FIG. 7 is an isometric view of an expansion card release mechanism installed on a motherboard, according to certain aspects of the present disclosure.

FIG. 7 is an isometric view of an expansion card release mechanism 730 installed on a motherboard 702, according to certain aspects of the present disclosure. Release mechanism 730 and motherboard 702 can be similar to release mechanism 230 and motherboard 202 of FIG. 2, respectively. For illustrative purposes, the expansion card release mechanism 730 is depicted as transparent.

The housing 734 of the release mechanism 730 can be removably coupled to the motherboard 702, such as disclosed with reference to FIG. 6. The housing 734 can include an opening 760 through which the expansion slot 704 can be accessed. When an expansion card is desired to be removed from the expansion slot 704, the handle 732 of the release mechanism 730 can be pulled, thus causing the contact surfaces 736 to move away from the motherboard 702, thus applying force to the expansion card to urge the expansion card out of and/or away from expansion slot 704.

Figure 8:
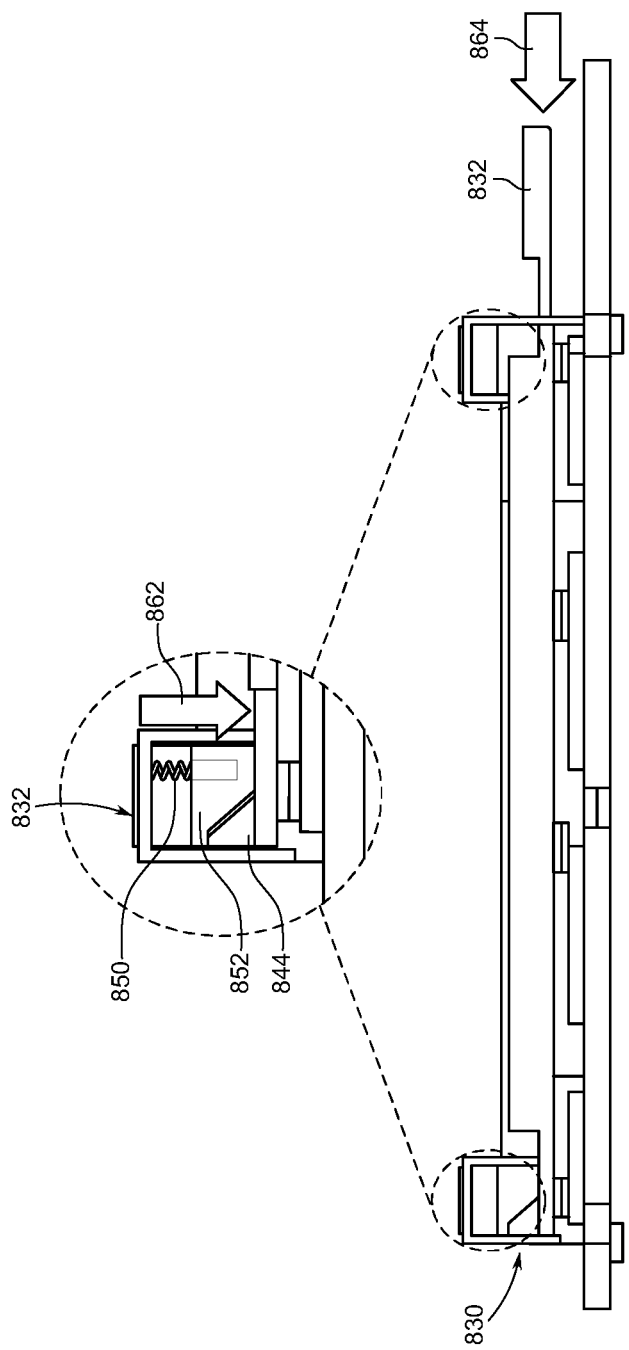
FIG. 8 is a combination side view and expanded cutaway side view of an expansion card release mechanism, according to certain aspects of the present disclosure.

FIG. 8 is a combination side view and expanded cutaway side view of an expansion card release mechanism 830, according to certain aspects of the present disclosure. Expansion card release mechanism 830 can be similar to release mechanism 230 of FIG. 2.

The release mechanism 830 depicted in FIG. 8 is shown after force being applied to the handle 832 has been removed. Biasing element 850 can urge the contact elements 852 in direction 862 (e.g., towards the motherboard, or downward as seen in FIG. 8). Because of the inclined plane interactions between the contact elements 852 and the slider 844, movement of the contact elements 852 in direction 862 can cause the slider 844, and thus handle 832, to move in direction 864.

Thus, after pulling on handle 832 to facilitate removal of an expansion card, the handle 832 can be released to allow the handle 832, slider 844, and contact elements 852 to return to retracted positions. When in retracted positions, the handle 832 can be pulled to cause slider 844 to move opposite direction 864, thus causing contact elements 852 to move opposite direction 862, thus moving the handle 832, slider 844, and contact elements 852 to extended positions.

Figure 9:
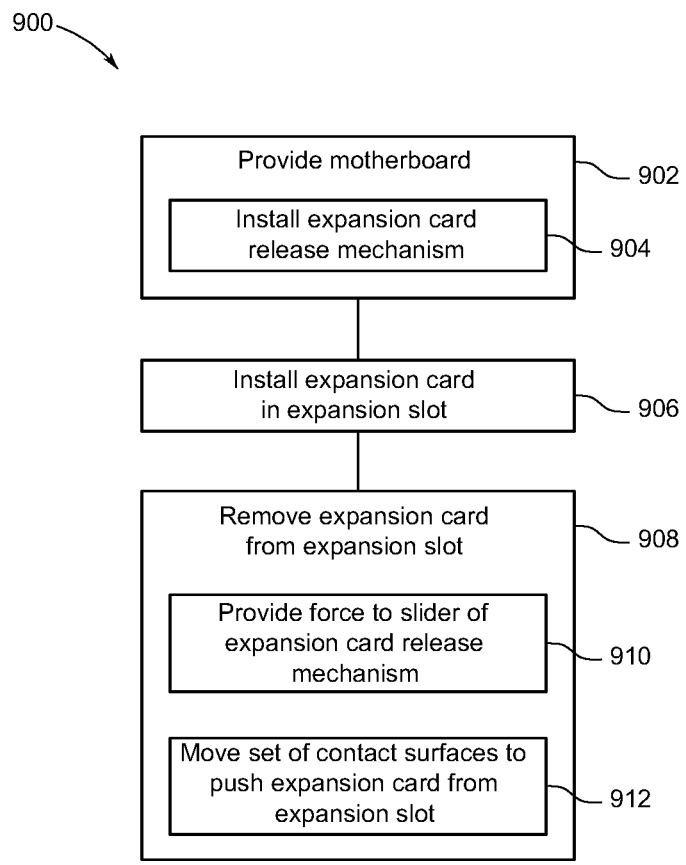
FIG. 9 is a flowchart depicting a process of using an expansion card release mechanism, according to certain aspects of the present disclosure.

FIG. 9 is a flowchart depicting a process 900 of using an expansion card release mechanism, according to certain aspects of the present disclosure. Process 900 can be used with release mechanism 230, motherboard 202, and expansion card 206 of FIG. 2.

At block 902, a motherboard can be provided. Providing the motherboard can include providing a motherboard with one or more expansion slots that are positioned to receive expansion cards in a direction perpendicular to a surface (e.g., a planar surface or a surface upon which the expansion slot is located) of the motherboard. In some cases, providing the motherboard can include providing a motherboard with an expansion card release mechanisms already coupled thereto. In some cases, however, providing the motherboard at block 902 can further include installing one or more expansion card release mechanisms at block 904. Installing an expansion card release mechanism at block 904 can optionally include making apertures in the motherboard, although in some cases, the motherboard can be pre-fabricated to include suitable apertures. Installing the expansion card release mechanism at block 904 can include inserting hooks of the release mechanism into apertures of the motherboard to removably couple the release mechanism to the motherboard.

At block 906, an expansion card can be installed in the expansion slot. In some cases, installing an expansion card in an expansion slot can include inserting a connector of the expansion card into the expansion slot in a direction perpendicular to the surface of the motherboard recited with respect to block 902. For example, this direction of installing the expansion card can be opposite direction 420 of FIG. 4.

At block 908, the expansion card can be removed from the expansion slot. Removing the expansion card at block 908 can include providing force to a slider of an expansion card release mechanism at block 910 and moving a set of contact surfaces to push the expansion card form the expansion slot at block 912.

At block 910, providing force to the slider can include manipulating a handle of the release mechanism, such as pulling on a handle of the release mechanism. Providing force to the slider can include moving the slider in a direction parallel the expansion slot. Providing force to the slider at block 910 can cause the slider to move in a direction perpendicular to the direction of installing the expansion card, such as direction 440 of FIG. 4.

At block 912, moving the set of contact surfaces can be in response to providing force to the slider at block 910. As the slider moves in the direction perpendicular to the direction of installing the expansion card, the slider can induce the contact surfaces to move in a direction opposite the direction of installing the expansion card. For example, providing the force to the slider at block 910 can cause the set of contact surfaces to move at block 912 in direction 420 of FIG. 4. In some cases, moving the set of contact surfaces at block 912 includes applying equal force to an expansion card via each of the set of contact surfaces.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A system, comprising:
    a motherboard having a top surface;
    an expansion slot directly coupled to the top surface of the motherboard for receiving an expansion card in a first direction perpendicular to the top surface of the motherboard, the expansion slot having a plurality of contacts for electrically coupling the expansion card to the motherboard; and
    an expansion card release mechanism directly coupled to the top surface of the motherboard, the expansion card release mechanism comprising:
        a housing directly attached to the top surface of the motherboard;
        a set of contact elements mounted in the housing, wherein the set of contact elements comprises a first contact surface located opposite the expansion slot from a second contact surface; and
        a slider directly mounted in the housing over the top surface of the motherboard, the slider movable in a second direction perpendicular to the first direction, wherein movement of the slider in the second direction induces movement of the set of contact elements in a third direction opposite to the first direction, wherein each contact surface of the set of contact elements is sized such that movement of the set of contact elements in the third direction provides a force to urge the received expansion card in the third direction.

2. The system of claim 1, wherein the expansion card release mechanism is positioned around the expansion slot.

3. The system of claim 1, wherein the expansion card release mechanism comprises one or more biasing devices held in the housing, the biasing devices are in contact with one contact element of the set of contact elements to bias the set of contact elements in the first direction.

4. The system of claim 1, wherein the motherboard comprises a set of apertures adjacent the expansion slot, and wherein the housing couples the expansion card release mechanism to the motherboard, wherein the housing comprises a set of hooks for engaging each of the set of apertures adjacent the expansion slot.

5. The system of claim 1, wherein the slider comprises a handle to facilitate moving the slider in the second direction, wherein the handle extends in the second direction past an edge of the expansion card such that the handle is accessible when the expansion card is installed in the expansion slot.

6. The system of claim 1, wherein movement of the set of contact elements in the third direction to provide the force to urge the expansion card in the third direction comprises providing equal force to the force at each of the contact surfaces of the set of contact elements.

7. The system of claim 1, wherein the housing of the expansion card release mechanism is separate from a housing of the expansion slot.

8. An expansion card release apparatus, comprising:
    a housing directly positioned on a top surface of a motherboard having an expansion slot directly coupled to the top surface of the motherboard for receiving an expansion card in a first direction perpendicular to a surface of the motherboard, the housing comprising a first end and a second end separated by an opening, wherein the opening is shaped to provide access to the expansion slot;
    a set of contact elements, wherein the set of contact elements comprises a first contact surface located at the first end of the housing and a second contact surface located at the second end of the housing; and an actuator mounted in the housing directly over the top surface of the motherboard, the actuator coupled to the set of contact elements to induce movement of the set of contact surfaces in a second direction opposite to the first direction, wherein each contact surface of the set of contact elements is sized such that movement of the set of contact elements in the second direction provides a force to urge the expansion card in the second direction.

9. The apparatus of claim 8, wherein the actuator comprises a slider, and wherein movement of the slider in a third direction perpendicular to the first direction induces movement of the set of contact elements in the second direction.

10. The apparatus of claim 8, further comprising one or more biasing devices held in the housing, the biasing devices in contact with one contact element of the set of contact elements to bias the set of contact elements in the first direction.

11. The apparatus of claim 8, wherein the housing comprises a set of hooks for engaging apertures of the motherboard to secure the housing to the motherboard.

12. The apparatus of claim 8, wherein the actuator comprises a handle to facilitate actuating the actuator, wherein the handle is sized to extend past an edge of the expansion card such that the handle is accessible when the expansion card is installed in the expansion slot.

13. The apparatus of claim 8, wherein movement of the set of contact surfaces in the second direction to provide the force to urge the expansion card in the second direction comprises providing the force at each of the contact surfaces of the set of contact elements.

14. The apparatus of claim 8, wherein the housing is separate from a housing of the expansion slot.

15. A method, comprising:
providing a motherboard having an expansion slot directly coupled to a top surface of the motherboard;
installing an expansion card in the expansion slot, wherein installing the expansion card includes inserting the expansion card into the expansion slot in a first direction perpendicular to the top surface of the motherboard; and
removing the expansion card from the expansion slot using an expansion card release mechanism having a housing directly attached to the top surface of the motherboard, wherein removing the expansion card using the expansion card release mechanism comprises:
providing a force to move a slider of the expansion card release mechanism in a second direction perpendicular to the first direction, wherein the slider is mounted in the housing directly over the top surface of the motherboard; and
moving a set of contact elements of the expansion card release mechanism in a third direction opposite the first direction in response to movement of the slider in the second direction, wherein each contact element of the set of contact elements is sized such that movement of the set of contact elements in the third direction provides the force from a set of contact surfaces of the set of contact elements to urge the expansion card in the third direction.

16. The method of claim 15, wherein providing the motherboard comprises coupling the expansion card release mechanism to the motherboard around the expansion slot.

17. The method of claim 15, wherein moving the set of contact elements of the expansion card release mechanism in the third direction in response to movement of the slider in the second direction comprises applying the force to overcome one or more biasing devices held in the housing and in contact with one contact surface of the set of contact surfaces, the biasing devices configured to bias the set of contact elements in the first direction.

18. The method of claim 15, wherein providing the motherboard comprises coupling the expansion card release mechanism to the motherboard by inserting a set of hooks of the expansion card release mechanism into a set of apertures of the motherboard.

19. The method of claim 15, wherein the slider comprises a handle to facilitate moving the slider in the second direction, wherein the handle extends in the second direction past an edge of the expansion card such that the handle is accessible when the expansion card is installed in the expansion slot.

20. The method of claim 15, wherein movement of the set of contact elements in the third direction to provide the force to urge the expansion card in the third direction comprises providing the force at each of the contact surfaces of the set of contact elements.

* * * * *